(12) United States Patent
Chen et al.

(10) Patent No.: US 12,058,839 B2
(45) Date of Patent: Aug. 6, 2024

(54) COOLING ASSEMBLY AND LIQUID COOLING APPARATUS

(71) Applicant: Celestica Technology Consultancy (Shanghai) Co. Ltd, Shanghai (CN)

(72) Inventors: Kai Chen, Shanghai (CN); Yaoyin Fan, Shanghai (CN); Mingqing Luo, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 234 days.

(21) Appl. No.: 17/832,723

(22) Filed: Jun. 6, 2022

(65) Prior Publication Data

US 2023/0209770 A1 Jun. 29, 2023

(30) Foreign Application Priority Data

Dec. 24, 2021 (CN) .......................... 202111600696.8
Dec. 24, 2021 (CN) .......................... 202123299728.3

(51) Int. Cl.
*H05K 7/20* (2006.01)

(52) U.S. Cl.
CPC ..... *H05K 7/20272* (2013.01); *H05K 7/20254* (2013.01); *H05K 7/2049* (2013.01)

(58) Field of Classification Search
CPC ...... G06F 1/20; G06F 2200/201; G06F 1/186; H01L 23/3672; H01L 23/4093; H05K 7/20772; H05K 7/20254; H05K 1/0203; H05K 2201/10159; H05K 1/181; H05K 2201/10545; H05K 7/20154; H05K 7/208; H05K 7/2049; H05K 7/20763; F28F 1/20; F28F 2275/08

USPC .......................................................... 361/715
See application file for complete search history.

(56) References Cited

U.S. PATENT DOCUMENTS

| | | | | | |
|---|---|---|---|---|---|
| 4,190,098 | A * | 2/1980 | Hanlon | ............... | H01L 23/4093 257/718 |
| 7,023,701 | B2 * | 4/2006 | Stocken | .............. | H01L 23/4338 361/716 |
| 7,969,736 | B1 * | 6/2011 | Iyengar | ............... | H01L 23/4338 174/15.1 |
| 10,866,621 | B2 * | 12/2020 | Selvidge | ................. | G06F 1/186 |
| 2006/0221573 | A1 * | 10/2006 | Li | .......................... | G11C 5/143 257/E23.101 |
| 2007/0211438 | A1 * | 9/2007 | Foster, Sr. | ............ | H01L 23/367 257/E23.102 |

(Continued)

*Primary Examiner* — Mandeep S Buttar
(74) *Attorney, Agent, or Firm* — IPRTOP LLC

(57) ABSTRACT

The present disclosure provides a liquid cooling assembly and a liquid cooling apparatus. The liquid cooling assembly includes: two heat conducting plates, configured to perform heat dissipation on a storage module attached to each of the heat conducting plates; a liquid cooling tube, disposed on an end of the each heat conducting plates and configured to perform liquid cooling on the heat conducting plates; and an elastic support, disposed between the two heat conducting plates and configured to apply elastic pressure to the heat conducting plates during attachment between the heat conducting plates and the storage modules, to cause the heat conducting plates to be tightly attached to surfaces of the storage modules, and cause the storage modules to be easily separated from the heat conducting plates after the elastic support is removed from the two heat conducting plates.

9 Claims, 6 Drawing Sheets

(56) References Cited

U.S. PATENT DOCUMENTS

| | | | |
|---|---|---|---|
| 2008/0089034 A1* | 4/2008 | Hoss | G06F 1/20 |
| | | | 361/721 |
| 2008/0251911 A1* | 10/2008 | Farnsworth | H01L 23/4093 |
| | | | 257/714 |
| 2009/0002951 A1* | 1/2009 | Legen | H01L 23/427 |
| | | | 165/104.33 |
| 2010/0252234 A1* | 10/2010 | Cambell | H01L 23/473 |
| | | | 165/80.2 |
| 2013/0306292 A1* | 11/2013 | Iyengar | H01L 23/3672 |
| | | | 165/185 |

\* cited by examiner

COOLING ASSEMBLY AND LIQUID COOLING APPARATUS

CROSS REFERENCE TO RELATED APPLICATION

The present application claims the benefit of priority to Chinese Patent Application No. CN 2021116006968, entitled "Cooling Assembly and Liquid Cooling Apparatus", filed with CNIPA on Dec. 24, 2021, and Chinese Patent Application No. CN 2021232997283, entitled "Cooling Assembly and Liquid Cooling Apparatus", filed with CNIPA on Dec. 24, 2021, the content of which is incorporated herein by reference in their entireties.

FIELD OF THE TECHNOLOGY

The present disclosure relates to the technical field of cooling for electronic devices, in particular, to the technical field of liquid cooling.

BACKGROUND

A liquid cooling apparatus may be configured for heat dissipation of a storage module in an electronic device. Currently, many liquid cooling apparatuses are fixed during use. The storage module compresses a surface of a liquid cooling apparatus when being inserted into a slot, to achieve liquid-cooled heat dissipation by means of the liquid cooling apparatus. However, a heat conducting gasket is abraded when the storage module is inserted into or removed from the slot. As a result, a thermally conductive interface material of the liquid cooling apparatus is easily damaged and times the liquid cooling apparatus can be inserted and removed are reduced.

A traditional liquid cooling apparatus is shown in FIG. 1. A liquid cooling assembly includes a liquid cooling tube 150, a heat conducting plate 120, and a heat conducting gasket 130. Multiple liquid cooling assemblies are connected in parallel and then fixed in a case. A storage module 110 is inserted into a slot 140 through a gap between the assemblies. In this solution, the liquid cooling tube 150, the heat conducting plate 120, and the heat conducting gasket 130 are all fixed, and only the storage module 110 is inserted and removed. When being inserted into the slot 140, the storage module 110 can compress the thermally conductive interface material to achieve effective contact with the heat conducting plate 120. In this way, a heat transfer resistance is reduced. In this design, the heat conducting gasket 130 is abraded during insertion and removal of the storage module 110. However, solutions of existing manufactures support only 30 times of insertion and removal. This solution has the problem that the thermally conductive interface material is easily damaged and allowed times of insertion and removal are small.

FIGS. 2-3 show another traditional liquid cooling apparatus. A heat conducting plate 240, a heat conducting gasket 220, and a storage module 210 are fixed by using a clip 270 to form an integral heat dissipation module, which realizes reliable and effective contact between the storage module 210 and the heat conducting plate 240. During the insertion and removal of the storage module 210, the storage module 210, the heat conducting gasket 220, and the heat conducting plate 240 are integrally inserted and removed. Therefore, no abrasion is caused to the heat conducting gasket 220 during the insertion and removal. However, in this solution, the heat conducting plate 240 and a liquid cooling tube 230 are two independent portions. In order to ensure effective heat conduction from the heat conducting plate 240 to the liquid cooling tube 230, it is necessary to increase a contact area between the heat conducting plate 240 and the liquid cooling tube 230. Therefore, as shown in FIG. 3, thermally conductive keys 280 spaced apart from each other are added under the heat conducting plate 240. The thermally conductive keys 280 spaced apart from each other can ensure that two adjacent storage modules 210 are both in reliable contact with the liquid cooling tube 230 without affecting the insertion and removal of the storage module 210. In this solution, the liquid cooling tube 230 is disposed in a gap between the storage modules disposed side by side, and is configured to cool the storage modules 210. A heat conducting gasket 250 is added to the liquid cooling tube 230, to ensure effective contact with the thermally conductive keys 280. Since a pressing force of the heat conducting gasket 250 between the liquid cooling tube 230 and the thermally conductive keys 280 is merely the insertion and removal force of the storage module 210, long-term operation reliability is low. In addition, since the heat conducting gasket 250 is added between the liquid cooling tube 230 and the thermally conductive keys 280, a large thermal resistance is caused during heat transfer.

As a result, the traditional liquid cooling apparatus has a problem that the thermally conductive interface material is easily damaged, or has a problem that a thermal resistance during the heat transfer between the liquid cooling tube and the heat conducting plate is large.

SUMMARY

The present disclosure provides a liquid cooling assembly and a liquid cooling apparatus, to resolve the technical problems of a conventional liquid cooling apparatus.

The liquid cooling assembly includes: two heat conducting plates, configured to perform heat dissipation on a storage module attached to each of the heat conducting plates; a liquid cooling tube, disposed on an end of the each heat conducting plates and configured to perform liquid cooling on the heat conducting plates; and an elastic support, disposed between the two heat conducting plates and configured to apply elastic pressure to the heat conducting plates during attachment between the heat conducting plates and the storage modules, to cause the heat conducting plates to be tightly attached to surfaces of the storage modules, and cause the storage modules to be easily separated from the heat conducting plates after the elastic support is removed from the two heat conducting plates.

In an embodiment of the present disclosure, the liquid cooling tube is connected to the heat conducting plates by using a flexible connector.

In an embodiment of the present disclosure, the flexible connector is an elastic metal sheet or a soft metal strap.

In an embodiment of the present disclosure, the elastic support is an elastic reed.

In an embodiment of the present disclosure, the elastic support is a U-shaped stopper mounted to top ends of two adjacent heat conducting plates.

In an embodiment of the present disclosure, the two heat conducting plates are connected to one liquid cooling tube.

In an embodiment of the present disclosure, each of the two heat conducting plates is correspondingly connected to one liquid cooling tube.

In an embodiment of the present disclosure, each of the heat conducting plates includes a heat conducting plate layer and a heat conducting gasket attached to a surface of the heat conducting plate layer.

In an embodiment of the present disclosure, the heat conducting gasket includes at least two heat conducting sub-gaskets. A length of each of the heat conducting sub-gaskets matches a length of a surface of the attached storage module.

The present disclosure further provides a liquid cooling apparatus. The liquid cooling apparatus includes at least two slots each configured for a storage module to be inserted into. A liquid cooling assembly described above is disposed between every two adjacent slots.

As described above, the liquid cooling assembly and the liquid cooling apparatus of the present disclosure have the following beneficial effects.

1. In the present disclosure, after the storage modules are inserted into the slots, an elastic reed 314 is stuffed between the two heat conducting plates or a U-shaped stopper is added to top ends of the metal plates, to realize reliable connection between the heat conducting gaskets on the heat conducting plates and the storage modules, thereby ensuring that heat can be effectively conducted from the storage modules to the heat conducting plates. When the storage modules are required to be removed, the U-shaped stopper or the elastic reed 314 is disassembled. Therefore, the heat conducting plates can be separated from the storage modules merely by properly deforming the heat conducting plates. During the removal of the storage modules, the heat conducting gaskets are not in contact with the storage modules. In this way, the heat conducting gaskets can be prevented from being abraded during the insertion and removal, thereby prolonging a service life of the heat conducting gaskets.

2. According to the present disclosure, the heat conducting plates are connected to the liquid cooling tube by using the elastic metal sheet or the soft metal strap. Therefore, effective heat conduction is ensured, and a deformation capacity is achieved. Since the heat conducting plates and the liquid cooling tube are an integrated structure, the connection is reliable. In addition, no heat conducting gasket is required to be added. Therefore, heat conducting resistance during heat transfer from the heat conducting plates to the liquid cooling tube can be reduced.

REFERENCE NUMERALS

Figure 1:
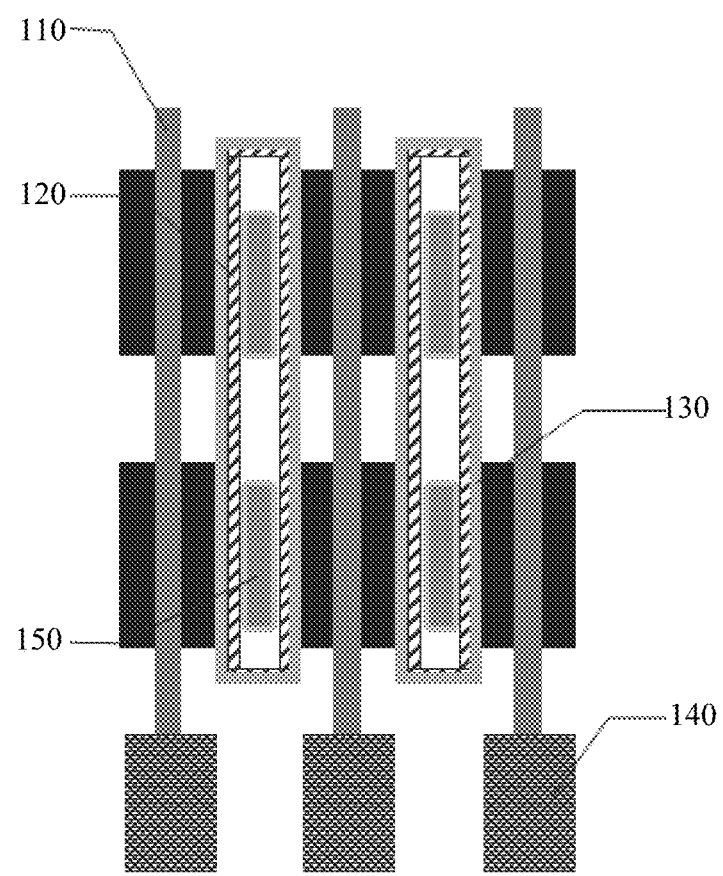
FIG. 1 is a schematic structural diagram of a liquid cooling apparatus having a storage module in the prior art.
Figure 2:
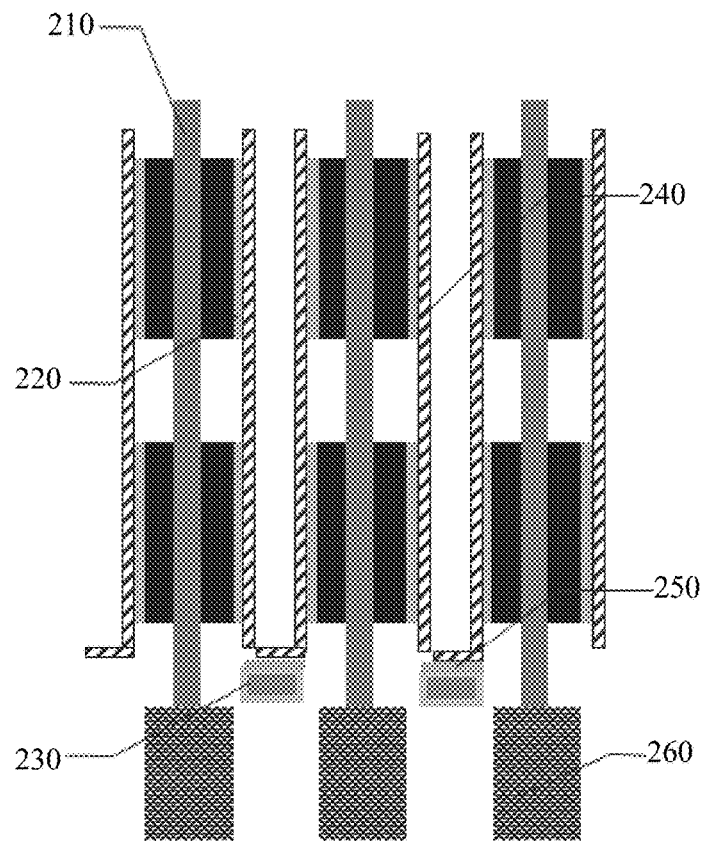
FIGS. 2 to 3 are schematic structural diagrams of a liquid cooling apparatus having a storage module in the prior art.
Figure 3:
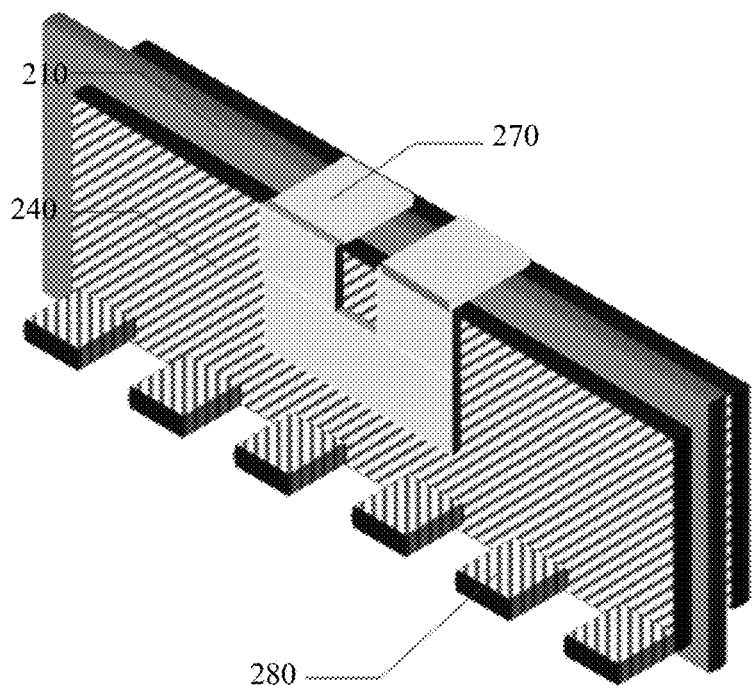

110 Storage module
120 Heat conducting plate
130 Heat conducting gasket
140 Slot
210 Storage module
220 Heat conducting gasket
230 Liquid cooling tube
240 Heat conducting plate
250 Heat conducting gasket
260 Slot
270 Clip
280 Thermally conductive key
300 Liquid cooling apparatus
310 Liquid cooling assembly
311 Heat conducting gasket
312, 313 Heat conducting plate
314 Elastic reed
315 First flexible connector
316 Second flexible connector
317 Liquid cooling tube
317a First liquid cooling sub-tube
317b Second liquid cooling sub-tube
318 U-shaped stopper
320 Storage module
330 Slot

DESCRIPTION OF THE SPECIFIC EMBODIMENTS

The following describes implementations of the present disclosure by using specific embodiments. A person skilled in the art may easily understand other advantages and effects of the present disclosure from the content disclosed in this specification.

Refer to FIGS. 4 to 7. It should be understood that all the structures, proportions, sizes, and the like depicted in the accompanying drawings of this specification are merely used for matching the content disclosed in this specification, for those skilled in the art to learn and read, but are not intended to limit restraint conditions under which the present disclosure can be implemented, therefore having no substantial meaning technically. Any modification of the structures, change of proportion relationships, or adjustment of the sizes shall fall within the scope of the technical content disclosed in the present disclosure without affecting the effects that can be generated and the objectives that can be achieved through the present disclosure. In addition, the terms such as "upper", "lower", "left", "right", "middle", and "a" mentioned in this specification are also merely for facilitating clear descriptions, but are not intended to limit the scope of implementation of the present disclosure. Without substantially changing the technical contents, changes or adjustments of relative relationships thereof should also fall within the scope of implementation of the present disclosure.

Some embodiments provide a liquid cooling assembly and a liquid cooling apparatus, to improve heat dissipation performance of the liquid cooling assembly and the liquid cooling apparatus.

As shown in FIGS. 4 to 7, principles and implementations of a liquid cooling assembly 310 and a liquid cooling apparatus 300 are described in detail below, so that the liquid cooling assembly 310 and the liquid cooling apparatus 300 can be understood by those skilled in the art.

As shown in FIGS. 4 to 7, some embodiments provide a liquid cooling assembly 310. The liquid cooling assembly 310 includes two heat conducting plates (a heat conducting plate 313 and a heat conducting plate 312), a liquid cooling tube 317, and an elastic support.

In some embodiments, the two heat conducting plates perform heat dissipation on a storage module 320 attached to each of the heat conducting plates. That is to say, one heat conducting plate correspondingly performs heat dissipation on one storage module 320. When each storage module 320 is inserted into a slot 330, two surfaces of the storage module 320 are respectively tightly attached to a surface of the corresponding heat conducting plate, thereby achieving cooled heat dissipation by using the heat conducting plates.

In some embodiments, the storage module 320 may be a memory module such as a dual in-line memory module (DIMM), or may be storage modules of other types such as a pluggable hard disk. The storage module is generally a to-be-cooled device having a to-be-cooled chip on a surface or has a relatively flat packaging surface. The module can be inserted into the slot.

Figure 4:
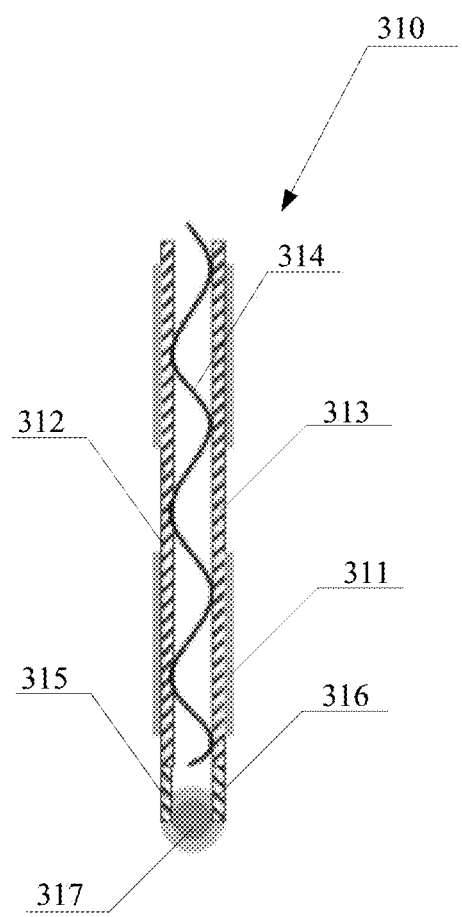
FIG. 4 is a schematic structural diagram of a liquid cooling assembly according to the present disclosure.
Figure 5:
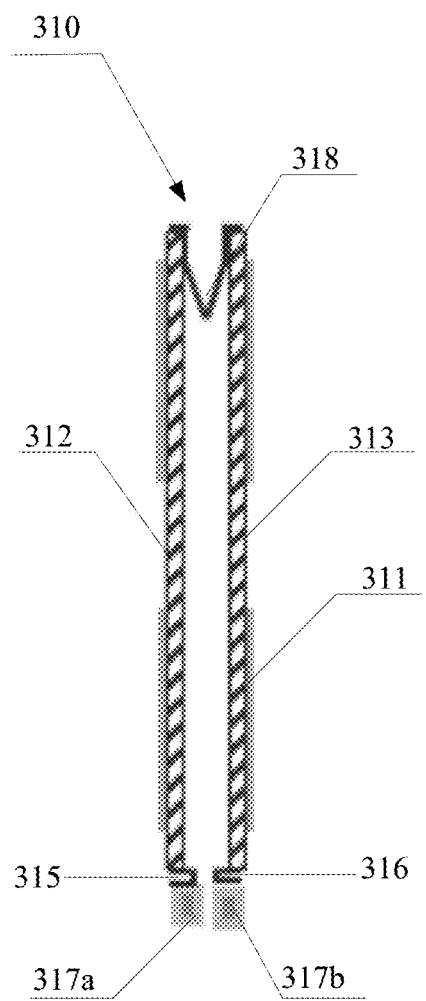
FIG. 5 is a schematic structural diagram of a liquid cooling assembly according to the present disclosure.

In some embodiments, as shown in FIG. 4 and FIG. 5, each heat conducting plate includes a heat conducting plate layer and a heat conducting gasket 311 attached to a surface of the heat conducting plate layer.

The heat conducting plate layer is an outer metal heat dissipation layer. The heat conducting gasket 311 is made of a heat conducting interface material. The heat conducting gasket 311 is directly tightly attached to a surface of the storage module 320 when the storage module 320 is inserted into the slot 330, to conduct heat of the storage module 320.

Specifically, in this embodiment, a length of the heat conducting plate layer may equal or not equal a length of the heat conducting gasket 311. When the length of the heat conducting plate layer does not equal the length of the heat conducting gasket 311, preferably, the length of the heat conducting gasket 311 matches a length of the surface of the storage module 320.

In some embodiments, the heat conducting gasket 311 includes at least two heat conducting sub-gaskets. A distance exists between two adjacent heat conducting sub-gaskets. A length of each heat conducting sub-gasket matches the length of the surface of the attached storage module 320. That is to say, in some embodiments, the heat conducting gasket 311 is segmented into a plurality of sections for heat dissipation of the storage module 320.

In some embodiments, the liquid cooling tube 317 is disposed on one end of the heat conducting plate and performs liquid cooling on the heat conducting plate.

Specifically, in some embodiments, the liquid cooling tube 317 is connected to the heat conducting plate by using a flexible connector.

That is to say, in some embodiments, the liquid cooling tube 317 is disposed on an end of the heat conducting plate and is connected to the heat conducting plate by using the flexible connector. Therefore, a junction between the liquid cooling tube 317 and the heat conducting plate is a deformable flexible junction. In this way, effective heat conduction between the liquid cooling tube 317 and the heat conducting plate is ensured, and a deformation capacity is achieved. Since the heat conducting plates and the liquid cooling tube 317 are an integrated structure, the connection is reliable. In addition, no heat conducting gasket 311 is required to be added between the liquid cooling tube 317 and the heat conducting plate. Therefore, heat conducting resistance during heat transfer from the heat conducting plates to the liquid cooling tube 317 can be reduced.

Preferably, the flexible connector includes a first flexible connector and a second flexible connector. One of the heat conducting plates is correspondingly connected to the first flexible connector, and the other of the heat conducting plates is correspondingly connected to the second flexible connector. In addition, the flexible connector may alternatively be an integrated structure. The two heat conducting plates are connected to one flexible connector.

Specifically, in some embodiments, as shown in FIG. 4, the flexible connector is a soft metal strap. One end of the soft metal strap is connected to the heat conducting plate, and the other end of the soft metal strap is connected to the liquid cooling tube. That is, the heat conducting plate is connected to the liquid cooling tube 317 by using the soft metal strap. Therefore, the junction between the liquid cooling tube 317 and the heat conducting plate is a deformable flexible junction. In this way, effective heat conduction between the liquid cooling tube 317 and the heat conducting plate is ensured, and the deformation capacity is achieved, thereby facilitating the insertion and removal of the storage module 320 and improving the performance of the liquid cooling apparatus 300.

In addition, in some embodiments, as shown in FIG. 5, the flexible connector may alternatively be an elastic metal sheet. The elastic metal sheet is in a bent and compressed state. A top end of the elastic metal sheet is connected to the heat conducting plate, and a bottom end of the elastic metal sheet is connected to the liquid cooling tube 317. An opening is formed on a side of the elastic metal sheet. The heat conducting plate may be moved in a vertical direction to expand or narrow the opening of the elastic metal sheet. In this way, the heat conducting plate connected to the elastic metal sheet has the deformation capacity. During the insertion and removal of the storage module 320, the heat conducting plate can be separated from the storage module 320, so that the heat conducting gasket 311 is prevented from being damaged due to the friction between the storage module 320 and the heat conducting gasket 311. In this way, the service life of the material of the heat conducting gasket 311 can be prolonged, and the storage module 320 can be inserted and removed much more times.

In addition, in some embodiment, as shown in FIG. 4, the two heat conducting plates may be connected to one liquid cooling tube 317. As shown in FIG. 5, alternatively, the two heat conducting plates each may be connected to one corresponding liquid cooling tube 317. That is to say, the liquid cooling tube 317 includes a first liquid cooling sub-tube 317a and a second liquid cooling sub-tube 317b. One heat conducting plate is connected to one corresponding liquid cooling tube 317. One of the heat conducting plates is connected to the first liquid cooling sub-tube 317a, and the other of the heat conducting plates is connected to the second liquid cooling sub-tube 317b.

In some embodiments, the elastic support is disposed between the two heat conducting plates and applies elastic pressure to the heat conducting plates during attachment between the heat conducting plates and the storage modules 320, to cause the heat conducting plates to be tightly attached to the surfaces of the storage modules 320, and cause the storage modules 320 to be easily separated from the heat conducting plates after the elastic support is removed from the two heat conducting plates.

In some embodiments, after the storage module 320 is inserted into the slot 330, the elastic support is stuffed between the two heat conducting plates, the elastic support applies an elastic force to surfaces of the heat conducting plates toward the storage module 320, so that the heat conducting plates are tightly attached to the surfaces of the storage module 320. In this way, the reliable connection between the heat conducting gaskets 311 on the heat conducting plates and the storage modules 320 is realized, thereby ensuring that heat can be effectively conducted from the storage modules 320 to the heat conducting plates.

When the storage module 320 is required to be removed from the slot 330, the elastic support is removed. That is to say, the elastic support is removed from the two heat conducting plates. In this case, no elastic support applies the elastic force to the heat conducting plates toward the storage module 320. Therefore, the heat conducting plates can be properly deformed, so that the heat conducting plates can be separated from the storage module 320. During the removal of the storage module 320, the heat conducting gasket 311 is not in contact with the storage module 320, so that the heat conducting gasket 311 can be prevented from being abraded during the insertion and removal. Therefore, a service life of the heat conducting gasket is prolonged, and overall performance of the liquid cooling apparatus 300 is improved.

Figure 6:
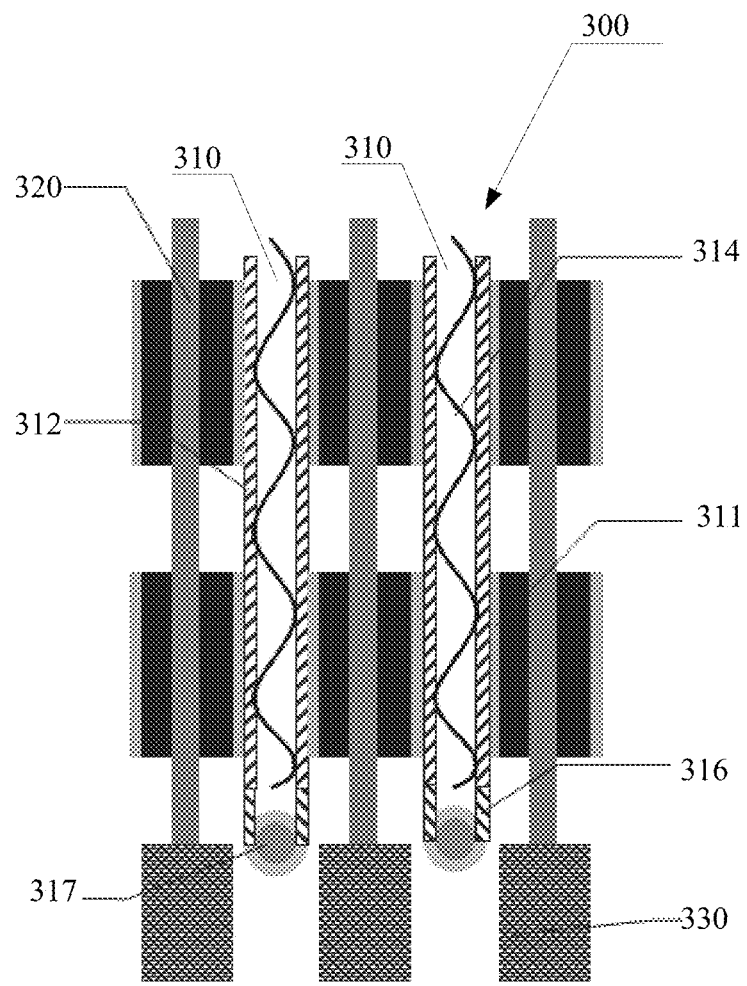
FIG. 6 is a schematic structural diagram of a liquid cooling apparatus according to the present disclosure.

Specifically, in some embodiments, as shown in FIGS. 4 and 6, the elastic support is an elastic reed 314. A length of the elastic reed 314 matches a length of the heat conducting plate. The elastic reed 314 is in a wavy shape and has a plurality of wavy bulges. The wavy bulges respectively abut against the heat conducting plates toward which the wavy bulges face, and apply elastic forces to the corresponding heat conducting plates towards the storage modules 320, so that the heat conducting plates are tightly attached to the surfaces of the storage modules 320. In this way, the reliable connection between the heat conducting gasket 311 on the heat conducting plate and the storage module 320 is realized, effective contact is ensured between the heat conducting plate and the storage module 320 after the storage module 320 is inserted, a resistance during heat transfer from the storage module 320 to the liquid cooling tube 317 is ensured, and a temperature of the storage module 320 is effectively controlled. When the storage module 320 is required to be removed from the slot 330, the elastic reed 314 is removed. That is to say, the elastic reed 314 is removed from the two heat conducting plates. In this case, since no elastic reed 314 applies the elastic force to the heat conducting plates toward the storage module 320. Therefore, the heat conducting plates can be properly deformed, so that the heat conducting plates can be separated from the storage module 320.

Figure 7:
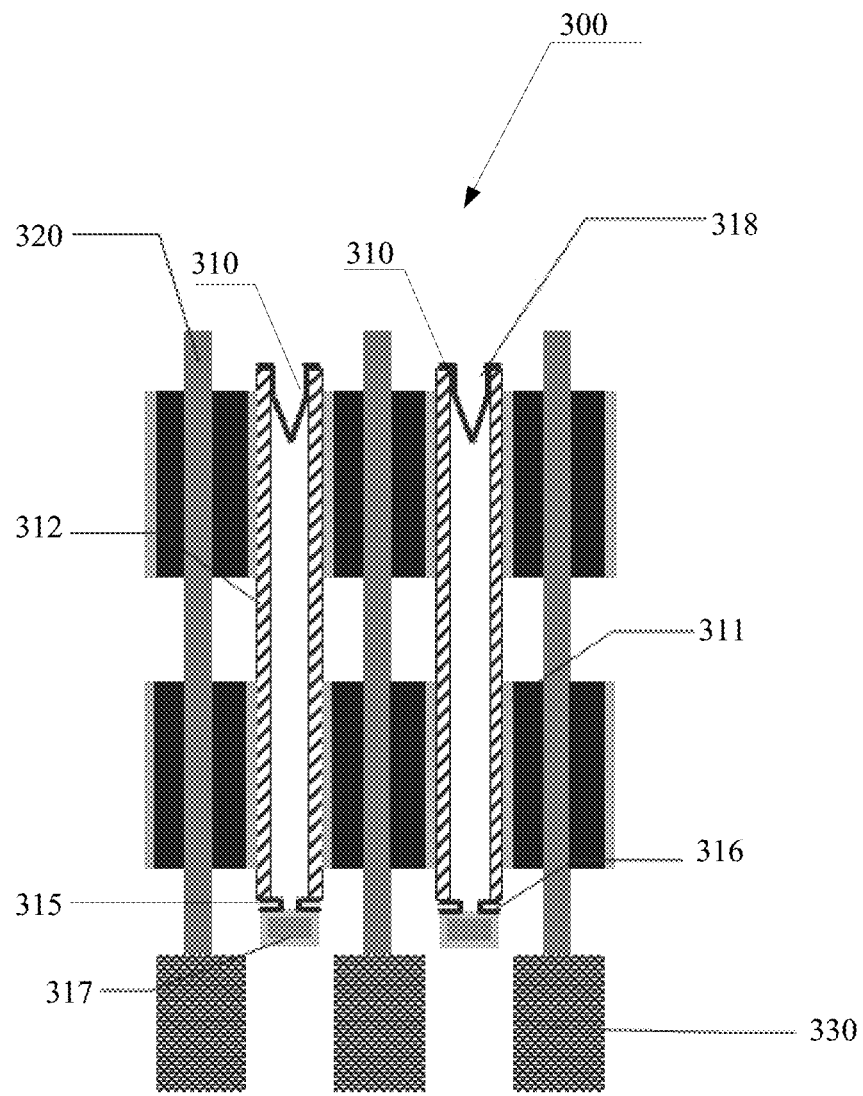
FIG. 7 is a schematic structural diagram of a liquid cooling apparatus according to the present disclosure.

In addition, in another embodiment, as shown in FIGS. 5 and 7, the elastic support is a U-shaped stopper 318 mounted to top ends of two adjacent heat conducting plates. Two top ends of the U-shaped stopper 318 each have a connection portion, and are connected to the top ends of the heat conducting plates by using the connection portions. For example, the top connection portions of the U-shaped stopper 318 are hooks. The hooks are disposed on the top ends of the heat conducting plates, to fix the U-shaped stopper 318 to the heat conducting plates.

Since two sides of the U-shaped stopper 318 respectively abut against the heat conducting plates toward which the two sides face, the U-shaped stopper 318 applies the elastic force to the heat conducting plates on the two sides toward the storage module 320, so that the heat conducting plates are respectively tightly attached to the surfaces of the storage modules 320. In this way, the reliable connection between the heat conducting gasket 311 on the heat conducting plate and the storage module 320 is realized, effective contact is ensured between the heat conducting plate and the storage module 320 after the storage module 320 is inserted, a resistance during heat transfer from the storage module 320 to the liquid cooling tube 317 is ensured, and a temperature of the storage module 320 is effectively controlled. When the storage module 320 is required to be removed from the slot 330, the U-shaped stopper 318 is removed. That is, the U-shaped stopper 318 is removed from the two adjacent heat conducting plates. In this case, since no U-shaped stopper 318 applies the elastic force to the heat conducting plates toward the storage module 320. Therefore, the heat conducting plates can be properly deformed, so that the heat conducting plates can be separated from the storage module 320.

In addition, as shown in FIGS. 6 to 7, some embodiments further provide a liquid cooling apparatus 300. The liquid cooling apparatus 300 includes at least two slots 330. Each of the slots 330 is for a storage module 320 to be inserted into. One liquid cooling assembly 310 described above is disposed between every two adjacent slots 330.

In this embodiment, a quantity of the slots 330 is at least two. Each of the slots 330 is for the storage module 320 to be inserted into. The slots 330 are arranged side by side. The liquid cooling assemblies 310 are connected in parallel and then fixed in a case. The storage module 320 is inserted into the slot 330 through a gap between the liquid cooling assemblies 310.

In this embodiment, a distance exists between the liquid cooling assembly 310 and the slot 330. The liquid cooling assembly 310 and the slot 330 are spaced apart from each other by a distance. The distance is determined according to a length of the liquid cooling assembly 310 and a length of the storage module 320 by a user. The liquid cooling assembly 310 has been described in detail above, and therefore is not described herein again.

In conclusion, according to the present disclosure, the heat conducting plates are connected to the liquid cooling tube by using the elastic metal sheet or the soft metal strap. Therefore, effective heat conduction is ensured, and a deformation capacity is achieved. Since the heat conducting plates and the liquid cooling tube are an integrated structure, the connection is reliable. In addition, no heat conducting gasket is required to be added. Therefore, heat conducting resistance during heat transfer from the heat conducting plates to the liquid cooling tube can be reduced. In the present disclosure, after the insertion, the elastic reed is stuffed between the two heat conducting plates or the U-shaped stopper is added to the top ends of the metal plates, to realize reliable connection between the heat conducting gaskets on the heat conducting plates and the storage modules, thereby ensuring that heat can be effectively conducted from the storage modules to the heat conducting plates. When the storage modules are required to be removed, the U-shaped stopper or the elastic reed is first disassembled. Therefore, the heat conducting plates can be separated merely by properly deforming the heat conducting plates. During the removal, the heat conducting gaskets are not in contact with the storage modules. In this way, the heat conducting gaskets can be prevented from being abraded during the insertion and removal, Therefore, the present disclosure effectively overcomes disadvantages in the prior art and has a high industrial value.

The above embodiments only exemplarily illustrate the principles and effects of the present disclosure, but are not used to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A liquid cooling assembly, comprising:
two heat conducting plates, configured to perform heat dissipation on a storage module attached to each of the heat conducting plates;
a liquid cooling tube, disposed on an end of the heat conducting plates and configured to perform liquid cooling on the heat conducting plates; and
an elastic support, disposed between the two heat conducting plates and configured to apply elastic pressure to the heat conducting plates during attachment between the heat conducting plates and the storage modules, to cause the heat conducting plates to be tightly attached to surfaces of the storage modules, and cause the storage modules to be easily separated from the heat conducting plates after the elastic support is removed from the two heat conducting plates;
wherein the elastic support is a U-shaped stopper mounted to top ends of two adjacent heat conducting plates.

2. The liquid cooling assembly as in claim 1, wherein the elastic support is an elastic reed.

3. The liquid cooling assembly as in claim 1, wherein the liquid cooling tube is connected to the heat conducting plates by using a flexible connector.

4. The liquid cooling assembly as in claim 3, wherein the flexible connector is an elastic metal sheet or a soft metal strap.

5. The liquid cooling assembly as in claim 1, wherein the two heat conducting plates are connected to one liquid cooling tube.

6. The liquid cooling assembly as in claim 1, wherein each of the two heat conducting plates is correspondingly connected to one liquid cooling tube.

7. The liquid cooling assembly as in claim 1, wherein each of the heat conducting plates comprises a heat conducting plate layer and a heat conducting gasket attached to a surface of the heat conducting plate layer.

8. The liquid cooling assembly as in claim 7, wherein the heat conducting gasket comprises at least two heat conducting sub-gaskets, and a length of each of the heat conducting sub-gaskets matches a length of a surface of the attached storage module.

9. A liquid cooling apparatus, comprising:
at least two slots, each configured for a storage module to be inserted into, wherein a liquid cooling assembly is disposed between every two adjacent slots, wherein the liquid cooling assembly comprises:
two heat conducting plates, configured to perform heat dissipation on a storage module attached to each of the heat conducting plates;
a liquid cooling tube, disposed on an end of the heat conducting plates and configured to perform liquid cooling on the heat conducting plates; and
an elastic support, disposed between the two heat conducting plates and configured to apply elastic pressure to the heat conducting plates during attachment between the heat conducting plates and the storage modules, to cause the heat conducting plates to be tightly attached to surfaces of the storage modules, and cause the storage modules to be easily separated from the heat conducting plates after the elastic support is removed from the two heat conducting plates;
wherein the elastic support is a U-shaped stopper mounted to top ends of two adjacent heat conducting plates.

* * * * *